(12) United States Patent
Vaisanen

(10) Patent No.: US 7,668,527 B2
(45) Date of Patent: Feb. 23, 2010

(54) MULTI-FUNCTION PASSIVE FREQUENCY MIXER

(75) Inventor: Risto Vaisanen, Salo (FI)

(73) Assignee: Nokia Corporation, Espoo (FI)

( * ) Notice: Subject to any disclaimer, the term of this patent is extended or adjusted under 35 U.S.C. 154(b) by 462 days.

(21) Appl. No.: 11/707,021

(22) Filed: Feb. 16, 2007

(65) Prior Publication Data

US 2008/0003973 A1    Jan. 3, 2008

(30) Foreign Application Priority Data

Jun. 30, 2006  (FI) .................... 20065464
Dec. 28, 2006  (FI) .................... 20065862

(51) Int. Cl.
*H04B 1/26* (2006.01)
*H04B 1/30* (2006.01)

(52) U.S. Cl. ..................................... 455/323

(58) Field of Classification Search ............... 455/323, 455/324, 325, 326, 333, 334, 341
See application file for complete search history.

(56) References Cited

U.S. PATENT DOCUMENTS

| | | | |
|---|---|---|---|
| 4,186,436 A | 1/1980 | Ishiwatari | |
| 5,397,931 A | 3/1995 | Bayer | |
| 5,475,337 A | 12/1995 | Tatsumi | |
| 5,550,728 A | 8/1996 | Ellis | |
| 5,574,457 A | 11/1996 | Garrity et al. | |
| 6,064,871 A | 5/2000 | Leung | |
| 6,091,940 A | 7/2000 | Sorrells et al. | |
| 6,198,645 B1 | 3/2001 | Kotowski et al. | |
| 6,429,632 B1 | 8/2002 | Forbes et al. | |
| 6,675,003 B1 | 1/2004 | Dubash et al. | |
| 6,999,747 B2 * | 2/2006 | Su ............................ | 455/324 |

(Continued)

FOREIGN PATENT DOCUMENTS

SE    470 298 B    1/1994

OTHER PUBLICATIONS

Jan Crols, et al., "A 1.5 GHz Highly Linear CMOS Downconversion Mixer," IEEE Journal of Solid-State Circuits, vol. 30, No. 7, Jul. 1995, pp. 736-742, IEEE, USA.

(Continued)

*Primary Examiner*—Blane J Jackson
(74) *Attorney, Agent, or Firm*—Squire, Sanders & Dempsey, LLP

(57) ABSTRACT

A frequency-mixing device performing voltage multiplying and low-pass filtering operations in addition to the frequency mixing is provided. The three operations may be carried out with the same components by designing the frequency mixer appropriately. The frequency mixer comprises a balanced input port to receive a balanced input signal, an oscillator signal input port to receive a first and a second oscillator signal and a first, a second, and a third capacitance. First switching means are arranged to connect, in response to the first oscillator signal, the first and the second capacitance between a first and a second input port of the balanced input port. Second switching means are arranged to connect, in response to the second oscillator signal, the first capacitance between the first input port and the third capacitance and the second capacitance between the second input port and the third capacitance. An output port is connected to terminals of the third capacitance.

36 Claims, 7 Drawing Sheets

U.S. PATENT DOCUMENTS

| | | | |
|---|---|---|---|
| 7,010,286 B2 | 3/2006 | Sorrells et al. | |
| 7,039,382 B2 * | 5/2006 | Shu | 455/313 |
| 7,062,248 B2 * | 6/2006 | Kuiri | 455/334 |
| 7,212,588 B1 | 5/2007 | Wong et al | |
| 7,218,899 B2 | 5/2007 | Sorrells et al. | |
| 7,248,850 B2 * | 7/2007 | Shen | 455/318 |
| 7,336,938 B1 | 2/2008 | Wong | |
| 7,460,844 B2 * | 12/2008 | Molnar et al. | 455/130 |
| 2005/0176396 A1 | 8/2005 | Miyahi | |
| 2007/0275684 A1 | 11/2007 | Harada et al. | |
| 2008/0001659 A1 | 1/2008 | Vaisanen | |

OTHER PUBLICATIONS

International Search Report, International Patent Application No. PCT/FI2007/050389, Date of Completion: Oct. 17, 2007, Date of Mailing: Oct. 26, 2007, pp. 1-4.

International Search Report, International Patent Application No. PCT/FI2007/050390, Date of Completion: Sep. 21, 2007, Date of Mailing: Oct. 24, 2007, pp. 1-2.

* cited by examiner

MULTI-FUNCTION PASSIVE FREQUENCY MIXER

FIELD

The present invention relates generally to radio frequency telecommunications and particularly to passive radio frequency mixers.

BACKGROUND

Radio transceivers typically include a frequency mixer which converts a signal from a baseband to a radio frequency (RF) band or vice versa. The frequency mixer upconverts a transmission signal from the baseband to the RF band in transmission and/or downconverts a received signal from the RF band to the baseband in reception. Alternatively, the received RF signal may be converted to an intermediate frequency band in some implementations.

The frequency mixer has a signal to be mixed, i.e. upconverted or downconverted, and one or more local oscillator signals as input signals, and it produces an output signal at a frequency which is a linear combination of the frequencies of the input signals. Typically, the local oscillator signals input to the frequency mixer are the same signal but with different phase shifts.

The mixer may be either a passive mixer or an active mixer. Passive mixers have no energy source but an input signal and a local oscillator signal. Accordingly, the output power may not be greater than the input power. Active mixers, on the other hand, require an additional energy source in order to amplify the input signal. Accordingly, the output power may be higher than the input power.

An advantage the active frequency mixer provides over the passive mixer is that the active frequency mixer amplifies the signal being frequency-mixed. As a result, the power of the resulting signal is higher when utilizing an active mixer. On the other hand, the amplification results in an increased noise power, too. Additionally, linearity properties of the active frequency mixers are generally quite poor, and the active mixers consume power which may be a limited resource in some implementations.

On the contrary, passive mixers have typically good linearity and noise properties and they do not consume power. Their only drawback is that they attenuate the signal being mixed instead of amplifying it. The level of the attenuation depends on the implementation.

FIG. 1 illustrates a prior art receiver structure which converts a received radio signal directly to the baseband. The receiver comprises a first amplifier 2 before mixers 4 and 5. The amplifier 2 is typically a low-noise amplifier. Bandpass filters 1 and 3 have been provided before and after the amplifier 2 to remove undesired frequency components. Frequency mixers 4 and 5 mix in-phase (I) and quadrature (Q) components of the received radio signal to the baseband with local oscillator signals LO_0, LO_90, LO_180, and LO_270. The number refers to the phase shift of the respective local oscillator signal. After the downmixing, baseband amplifiers 6 and 7 amplify the downmixed I and Q components, respectively, and low-pass filters 8 and 9 remove harmonic signal components resulting in the downmixing. Amplifiers 10 and 11 further amplify the low-pass filtered signals before analog-to-digital (A/D) conversion in an A/D-converter 12.

Typically, noise figures of the baseband amplifiers 6 and 7 are relatively poor due to flicker noise (known also as 1/f noise), among others. Therefore, the signal levels obtained from the mixers 4 and 5 have to be higher than the noise level of the baseband amplifiers 6 and 7. If the mixers 6 and 7 are passive mixers, the total noise figure of the receiver may be improved only in the first amplifier 2 before the mixers 4 and 5. In this case, the level of the output signal of the amplifier 2 may rise so high that good linearity properties of the passive mixers are wasted. As a consequence, the advantages of the passive mixers over the active mixers are also wasted.

Another problem related to the passive mixers is that designing a low-pass filter to follow a passive mixer may be difficult task. The low-pass filter should be located before the first baseband amplifier in order to prevent cross modulation and inter modulation caused by undesired strong signal components. In CMOS implementations, it is extremely difficult to define the corner frequency of the filter accurately, since an output impedance of the mixer, the pulse ratio of a local oscillator and the tolerances of capacitance values of the mixer components affect the corner frequency. Thus, the filter is typically arranged to follow the first baseband amplifier, which results in performance close to that of an active mixer and, therefore, the advantages gained by utilizing the passive frequency mixer are wasted.

BRIEF DESCRIPTION OF THE INVENTION

An object of the invention is to overcome the limitations and problems related to the conventional frequency mixers by providing an improved frequency mixer, an improved frequency mixing method and an improved radio transceiver.

According to an aspect of the invention, there is provided an apparatus, comprising an input interface comprising a balanced input port to receive a balanced input signal and an oscillator signal input port to receive a first and a second oscillator signal, a first, a second, and a third capacitance, first set of switches responsive to the first oscillator signal and arranged to connect, in response to the first oscillator signal, the first and the second capacitance between a first and a second input port of the balanced input port, second set of switches responsive to the second oscillator signal and arranged to connect, in response to the second oscillator signal, the first capacitance between the first input port and the third capacitance and the second capacitance between the second input port and the third capacitance, and an output port connected to terminals of the third capacitance.

According to another aspect of the invention, there is provided a frequency-mixing device comprising the above-described apparatus.

According to another aspect of the invention, there is provided a radio apparatus comprising the above-described apparatus.

According to another aspect of the invention, there is provided a method, comprising: receiving an input signal through a first and a second input port of a balanced input port and a first and a second oscillator signal through an oscillator signal input port, connecting, in a first stage in response to a first oscillator signal, a first and a second capacitance between the first and the second input port of the balanced input port, connecting, in a second stage in response to a second oscillator signal, the first capacitance between the first input port and a third capacitance and the second capacitance between the second input port and the third capacitance, and obtaining the voltage over the third capacitance as an output voltage.

According to another aspect of the invention, there is provided an apparatus, comprising input means comprising a first and a second input port of a balanced input port to receive a balanced input signal and an oscillator signal input means to receive a first and a second oscillator signal, first, second, and third capacitance means, means for connecting, in a first stage in response to the first oscillator signal, the first and the second capacitance means between the first and the second input port of the balanced input port, means for connecting, in a second stage in response to the second oscillator signal, first capacitance between the first input port and a third capacitance and the second capacitance between the second input port and the third capacitance, and means for obtaining the voltage over the third capacitance as an output voltage.

LIST OF DRAWINGS

In the following, the invention will be described in greater detail with reference to the embodiments and the accompanying drawings, in which FIG. 1 illustrates the structure of a conventional radio receiver including conventional frequency mixers;

DESCRIPTION OF EMBODIMENTS

Figure 1:
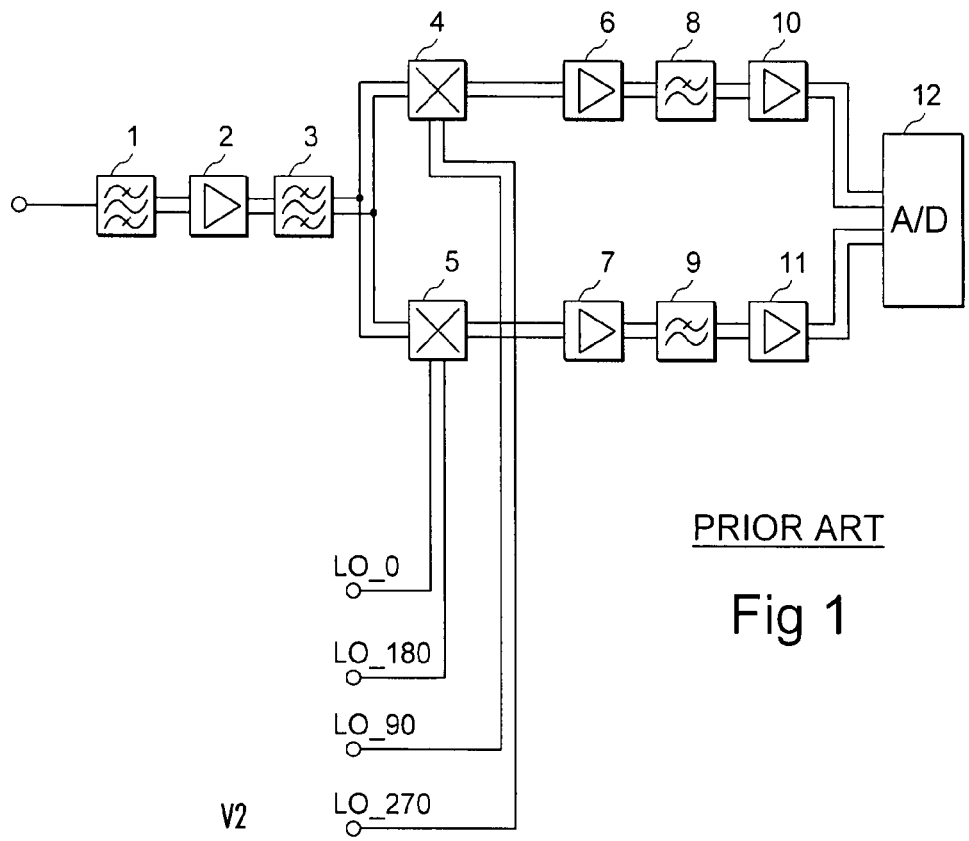
Figure 2:
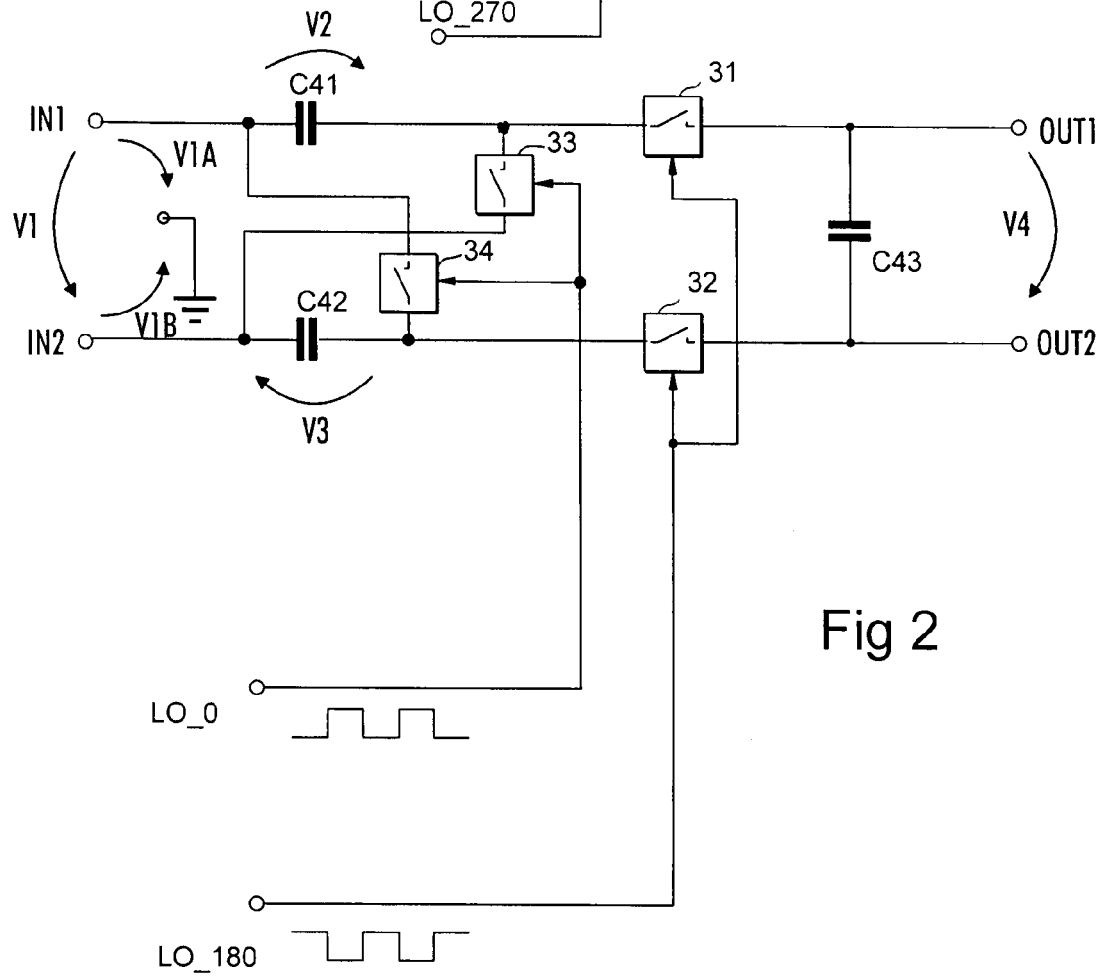
FIG. 2 illustrates a frequency mixer according to an embodiment of the invention.

With reference to FIG. 2, examine a frequency mixer according to an embodiment of the invention. The frequency mixer functions as a voltage multiplier and a low-pass filter in addition to the frequency mixing functionality. The frequency mixer according to the embodiment of the invention is a passive mixer, i.e. it does not introduce additional power to the input signal. With proper utilization of passive components, the amplitude of an input signal may, however, be multiplied. That is, the input signal may be frequency-mixed (down/upconverted), amplified, and low-pass filtered by utilizing the same, passive components. The embodiment of the invention described with reference to FIG. 2 roughly triples the input voltage.

The frequency mixer comprises an input interface including a balanced input port to receive a balanced input signal to be amplified. The balanced input port comprises a first and a second input port IN1 and IN2 to receive a balanced input signal. As known in the art, the balanced input signal comprises two components having opposite phases. Referring to FIG. 2, a signal input to the second input port IN2 is accordingly an inverted version of a signal input to the first input port IN1.

The input interface further comprises an oscillator signal input port to receive a first and a second oscillator signal LO_0 and LO_180. A local oscillator may provide a local oscillator signal which may be modified into the first and the second oscillator signals LO_0 and LO_180 input to the oscillator signal input port of the amplifier. The oscillator signals LO_0 and LO_180 may be modified to have substantially the same frequency and opposite phases. That is, if the phase of the first local oscillator signal LO_0 is zero degrees, the phase of the second local oscillator signal LO_180 is 180 degrees.

The frequency mixer further comprises a first and a second output port OUT1 and OUT2 of a balanced output port. Accordingly, the frequency mixer outputs a balanced output signal through the output ports OUT1 and OUT2 of the balanced output port.

The frequency mixer according to the embodiment of the invention includes a first capacitance C41, a second capacitance C42, and a third capacitance C43. The first capacitance C41 has its first terminal connected to the first input port IN1 of the balanced input port. Correspondingly, the second capacitance C42 has its first terminal connected to the second input port IN2 of the balanced input port. The third capacitance C43 has its first terminal connected to the first output port OUT1 of the balanced output port and second terminal connected to the second output port OUT2 of the balanced output port.

Additionally, the frequency mixer comprises a first set of switches responsive to the first oscillator signal LO_0 and a second set of switches responsive to the second oscillator signal LO_180. Accordingly, each switch of the first set of switches receives the first oscillator signal LO_0 as a control signal controlling the operation of the switches. Correspondingly, each switch of the second set of switches receives the second oscillator signal LO_180 as a control signal controlling the operation of the switches. The switches may be configured to be closed when the level of a controlling oscillator signal is high and be open when the level of the controlling oscillator signal is low.

In the embodiment illustrated in FIG. 2, the first set of switches comprises a first switch 33 and a second switch 34. The first switch 33 may be disposed between a second terminal of the first capacitance C41 and the second input port IN2, and the second switch 34 may be disposed between the first input port IN1 and a second terminal of the second capacitance C42. The second set of switches comprises a third switch 31 and a fourth switch 32. The third switch 31 may be disposed between the second terminal of the first capacitance C41 and the first terminal of the third capacitance C43. The fourth switch 32 may be disposed between the second terminal of the second capacitance C42 and the second terminal of the third capacitance C43.

The operation of the mixer according to the embodiment of the invention may be divided into two stages within one period of the oscillator signals LO_0 and LO_180. The first stage comprehends the first half-cycle of the oscillator signal period, and the second stage comprehends the second half-cycle following the first half-cycle. Since the oscillator signals LO_0 and LO_180 have opposite phases, the level of the first oscillator signal LO_0 is high in the first stage while the level of the second oscillator signal LO_180 remains low. In the second stage, the level of the second oscillator signal LO_180 is high while the level of the first oscillator signal LO_0 remains low.

Accordingly, the first set of switches (switches 33 and 34) are closed in the first stage and the second set of switches (switches 31 and 32) are open. Thereby, the switches 31 to 34 form a circuit illustrated in FIG. 3A. That is, the first and the second capacitance C41 and C42 are connected in parallel between the first and the second input ports IN1 and IN2. In more detail, the first terminals of the first and the second capacitance C41 and C42 remain connected to the first and the second input port IN1 and IN2, respectively. The first switch 33 connects the second terminal of the first capacitance C41 to the second input port IN2, and the second switch 34 connects the second terminal of the second capacitance C42 to the first input port IN1.

Figure 4:
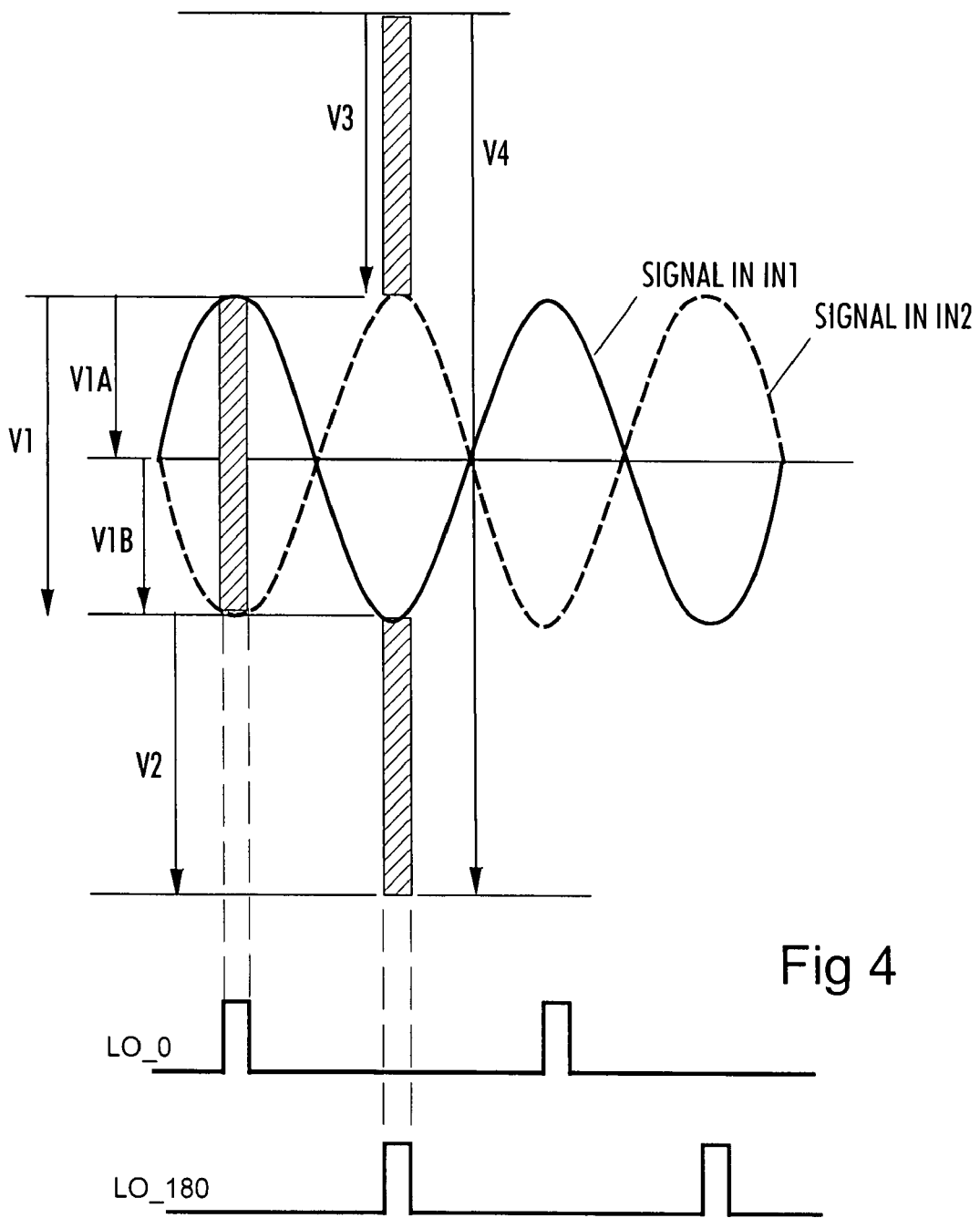
FIG. 4 illustrates signals input to the passive frequency mixer illustrated in FIG. 2 and voltage levels in components of the passive frequency mixer.

In the first stage, a voltage over the input ports IN1 and IN2 is charged into the first and the second capacitance C41 and C42. The voltages over the first and the second input port IN1 and IN2 are illustrated in FIG. 4. With reference to FIGS. 2 and 4, voltage V1A represents the voltage between the first input port IN1 and the ground level, and voltage V1B represents the voltage between the second input port IN2 and the ground level. Voltage V1 represents the voltage between the first and the second input port IN1 and IN2, voltage V2 represents the voltage over the first capacitance C41, and voltage V3 represents the voltage over the second capacitance C42. Signals input into the input ports IN1 and IN2 are also illustrated in FIG. 4. Accordingly, the first and the second capacitance C41 and C42 are both charged with voltage V1 in the first stage. In other words, V2 and V3 equal to V1.

In the second stage, the first set of switches (switches 33 and 34) is open while the second set of switches (switches 31 and 32) is closed. Thereby, the switches 31 to 34 form a circuit illustrated in FIG. 3B. That is, the first and the second capacitance C41 and C42 are now connected in series with the third capacitance C43 between the input ports IN1 and IN2. In more detail, the third switch 31 connects the second terminal of the first capacitance C41 to the first terminal of the third capacitance C43, and the fourth switch 32 connects the second terminal of the second capacitance C42 to the second terminal of the third capacitance C43.

As a result, the first and the second capacitance C41 and C42 release their charges into the third capacitance C43 in the second stage. In addition to the voltages charged into the first and the second capacitance C41 and C42 in the first stage, the third capacitance C43 is charged with the current voltage over the input ports IN1 and IN2 summing up together with the voltages in the first and the second capacitance C41 and C42 in the second stage. Referring to FIG. 4, voltage V2 represents the voltage charged into the first capacitance C41 just before closing the second set of switches, and voltage V3 represents the voltage charged into the second capacitance C42 just before closing the second set of switches. Accordingly, the sum of voltages V2 and V3 is charged into the third capacitance C43 together with the current voltage V1' between the input ports IN1 and IN2 of the balanced input port, i.e. the voltage V4 over the third capacitance C43 becomes V4=V1'+V2+V3. The first and the second output port OUT1 and OUT2 of the balanced output port may be connected to the first and the second terminal of the third capacitance C43, respectively.

Let us now study FIG. 4 in more detail. The oscillator signals LO_0 and LO_180 have the same frequency as the input signal fed into the input ports IN1 and IN2 and, therefore, the input signals are downconverted directly into a baseband. The input signals considered in this example are sinusoidal signals for the sake of simplicity. In the first stage, the level of the signal in the first input port IN1 reaches its positive maximum, and the level of the signal in the second input port IN2 reaches its negative maximum. This difference in the levels illustrated in FIG. 4 as blocks having slashed lines is charged into both first and the second capacitance C41 and C42. In the second stage, the level of the signal in the first input port IN1 reaches its negative maximum, and the level of the signal in the second input port IN2 reaches its positive maximum. This difference in levels of the input signals, i.e. a peak-to-peak voltage difference, is charged into the third capacitance C43 in conjunction with the voltages contained in the first and the second capacitance C41 and C42. Since the third capacitance is charged with the peak-to-peak voltage of the current input signals and the peak-to-peak voltages contained in the first and the second capacitance C41 and C42, the input voltage V1 is roughly tripled. In other words, the amplification of the passive amplifier according to this embodiment of the invention is 9.5 dB, which is naturally effected by the actual implementation and the properties of the components used in the amplifier. As a matter of fact, the amplification is roughly 9.5 dB higher than the amplification of a conventional passive mixer. The amplification of 9.5 dB is obtained with a passive mixer structure without an additional power supply (except the oscillator signals, of course). While the frequency mixer according to the embodiment of the invention does not bring additional power to the input signal, it improves the noise figure of a radio receiver utilizing the frequency mixer.

The principles of the frequency mixer according to the embodiment of the invention are based on charging the first and the second capacitance C42 and discharging them serially with the input signals to the third capacitance C43. This operation of sequentially charging and discharging the first capacitance C41 makes the first capacitance C41 and the first and the third switch 33 and 31 to function as a resistor implemented with a switched capacitor filter (SC filter) technique.

Figure 5A:
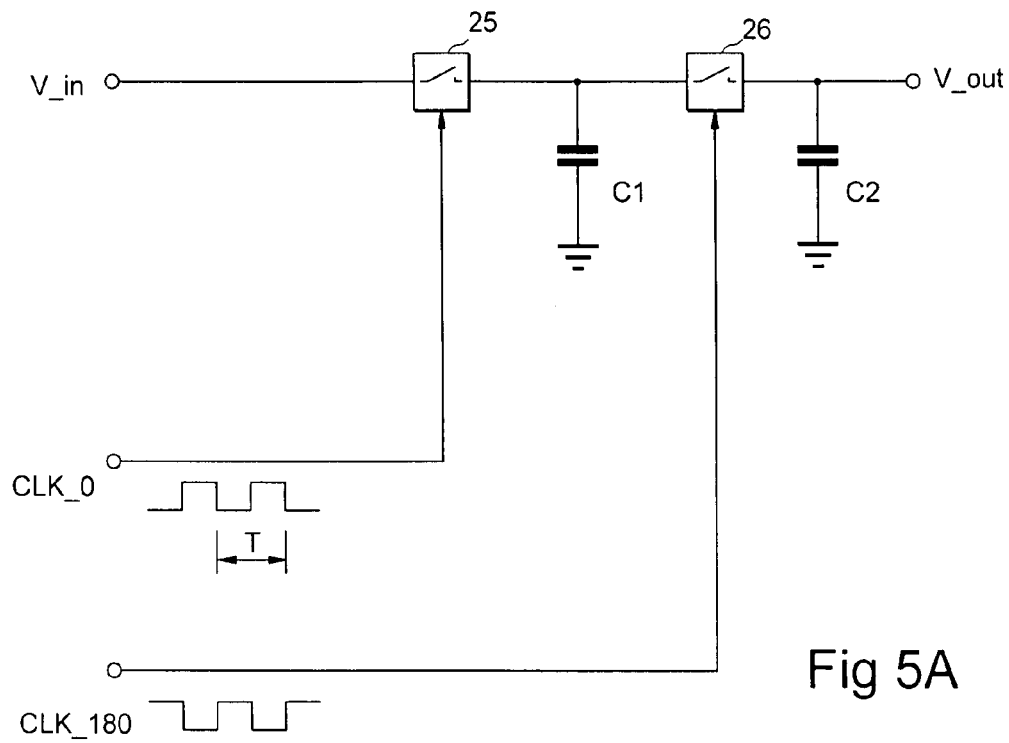
FIG. 5A illustrates a filter structure implemented according to the switched capacitor filter principle.
Figure 5B:
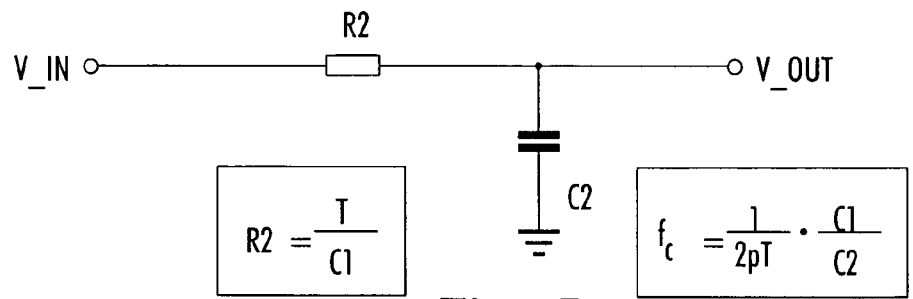
FIG. 5B illustrates an equivalent circuit for the filter structure illustrated in FIG. 5A.

FIGS. 5A and 5B illustrate a schematic diagram of a low-pass filter implemented with the SC filter technique (FIG. 5A) and its equivalent circuit (FIG. 5B). Switches 25 and 26 operated according to respective oscillator signals CLK_0 and CLK_180 and a first capacitor between the switches 25, 26 function as a resistor having a resistance R2=T/C1, where T is the period of the oscillator signals CLK_0 and CLK_180 and C1 is the capacitance of the first capacitor. V_in denotes an input port and V_out an output port of the filter. The equivalent circuit is illustrated in FIG. 5B in which the switches 25 and 26 and the first capacitor have been replaced with a resistor having resistance R2. Additionally, the SC filter includes a second capacitor connected in parallel to the second switch 26. The corner frequency of the SC filter is defined as:

$$f_c = \frac{1}{2\pi T} \cdot \frac{C1}{C2}, \qquad (1)$$

where C2 is the capacitance of the second capacitor. It can be seen that if the frequency of the oscillator signals is constant, the corner frequency depends on the ratio of the capacitances C1 and C2. In CMOS implementations, the absolute capacitance values may have a high diversity, but the ratio of the capacitances remains very accurate. That is, the ratio C1/C2 remains quite constant regardless of variations in the absolute values of C1 and C2. Accordingly, the corner frequency may be defined accurately and it has only marginal variations.

Consequently, the frequency mixer according to an embodiment of the invention may be used as a low-pass filter by designing the components, i.e. the first, second, and the third capacitance C41 to C43, the first and the second set of switches 31 to 34 and the oscillator signals LO_0 and LO_180 properly. Now, the first and the third switch 33 and 31 and the first capacitance C41 function as a first resistor, and the second and the fourth switch 34 and 32 and the second capacitance C42 function as a second resistor. The corner frequency is defined by the ratio of the capacitance values of the first and the third capacitance C41 and C43 and the ratio of the capacitance values of the second and the third capacitance C42 and C43. If the capacitance value of the second capacitance C42 equals to that of the first capacitance C41, the corner frequency simplifies into $$f_c = \frac{1}{4\pi T} \cdot \frac{C41}{C43}. \qquad (2)$$

Accordingly, the frequency mixer according to an embodiment of the invention is configured to function also as a low-pass filter having a corner frequency defined by capacitance values of the first, second, and third capacitance C41, C42, and C43. Therefore, no additional components are required for implementation of the low-pass filter. This reduces the size of a receiver structure employing the passive frequency mixer according to the embodiment of the invention. Although the first and the second capacitance C41 and C42 are now serially connected to the input port of the frequency mixer, instead of parallel connection of the first capacitor illustrated in FIG. 5A, they still have the same functionality when it comes to the low-pass filtering property of the frequency mixer.

If the frequency mixer is configured to mix the input RF signal to an intermediate frequency instead of baseband, the corner frequency $f_c$ may be designed to be high enough so that the undesired high frequency components will be filtered.

The above description of the embodiment of the frequency mixer includes simplifications which help the reader to understand the functionalities of the frequency mixer. For instance, a sinusoidal input signal was considered. In case of a modulated input signal, the effect is, however, the same. Let us assume that the RF frequency of an input signal is 2 GHz and the modulation bandwidth is 2 MHz, and that the input signal is mixed to the baseband. In order to produce one period of output baseband signal, approximately 1000 periods of RF signal have to be processed. Single operations of charging and discharging the capacitances C41 to C43 do not appear in the output signal as single incidences due to the low-pass filtering property.

Figure 6:
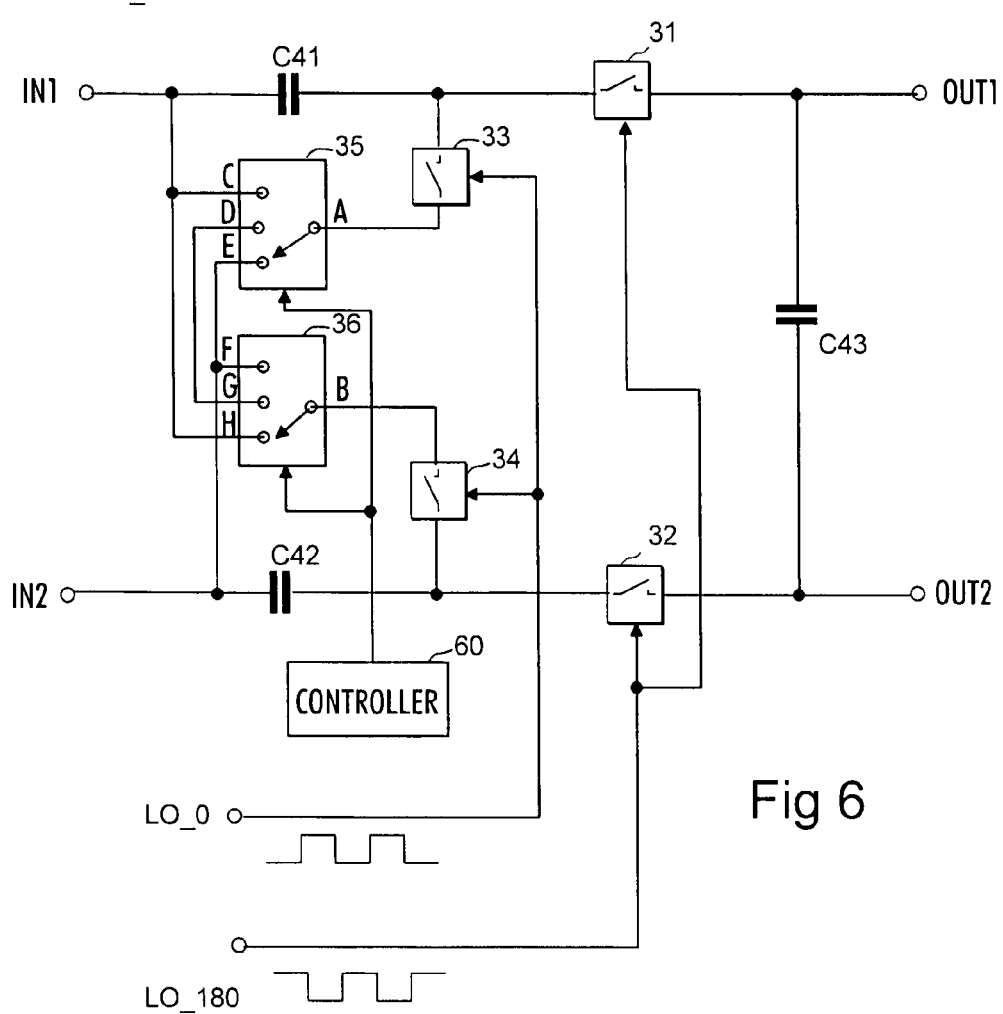
FIG. 6 illustrates a frequency mixer according to an embodiment of the invention having an automatic gain control feature.

FIG. 6 illustrates an amplifier configuration similar to that illustrated in FIG. 2. In the embodiment illustrated in FIG. 6, a first connection port A is arranged to be in connection with a terminal of the first switch 33 not connected to the first capacitance C41. In a similar way, a second connection port B is arranged to be in connection with a terminal of the second switch 34 not connected to the second capacitance C42. Accordingly, the first switch 33 is located between the first connection port A and the second terminal of the first capacitance C41, and the second switch 34 is located between the second connection port B and the second terminal of the second capacitance C42. A first switching mechanism 35 is arranged to be connected to the first connection port A, and a second switching mechanism 36 is arranged to be connected to the second connection port B. The first switching mechanism 35 is configured to connect the first connection port A to one of output ports C, D, or E of the first switching mechanism 35. Similarly, the second switching mechanism 36 is configured to connect the second connection port B to one of output ports F, G, or H of the second switching mechanism 36. Output port C of the first switching mechanism 35 and output port H of the second switching mechanism 36 are connected to the first input port IN1 of the balanced input port. Output ports D and G are connected to each other, and output port E and output port F are connected to the second input port IN2 of the balanced input port. In this embodiment, it is possible to control the amplification or voltage multiplication factor of the frequency mixer by connecting the connection ports A and B appropriately, thereby adding an automatic gain control (AGC) amplification functionality into the frequency mixer.

Figure 3A:
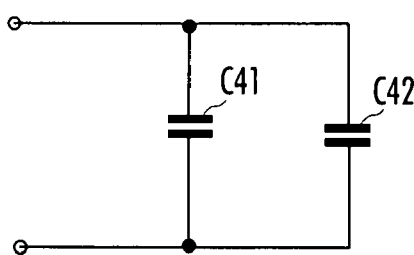
FIG. 3A illustrates an equivalent circuit in a first stage of the operation of the passive frequency mixer illustrated in FIG. 2.
Figure 3B:
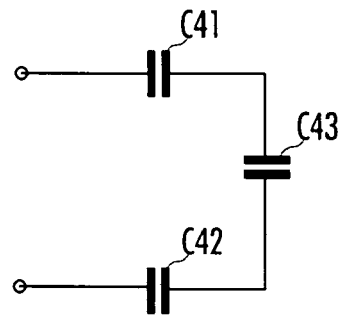
FIG. 3B illustrates an equivalent circuit in a second stage of the operation of the passive frequency mixer illustrated in FIG. 2.

The first and the second switching mechanism may be controlled by a controller 60 according to the desired voltage multiplication factor. The controller 60 may determine the desired voltage multiplication factor according to a method known in the art related to AGC amplifiers. When the desired voltage multiplication factor is three (amplification is 9.5 dB), the controller 60 may control the first switching mechanism 35 to connect the first connection port A to output port E, i.e. to the second input port IN2, and the second switching mechanism 36 to connect the second connection port B to output port H, i.e. to the first input port IN1. This configuration corresponds to the embodiment described above with reference to FIG. 2. Accordingly, the first and the second capacitance C41 and C42 are connected in parallel between the input ports IN1 and IN2 of the balanced input port in the first stage (as illustrated in FIG. 3A) and in series with the third capacitance C43 between the input ports in the second stage (as illustrated in FIG. 3B).

When the desired voltage multiplication factor is two (amplification is 6 dB), the controller 60 may control the first switching mechanism 35 to connect the first connection port A to output port D and the second switching mechanism 36 to connect the second connection port B to output port G. In other words, the first connection port A is connected to the second connection port B. Accordingly, the first and the second capacitance C41 and C42 are connected in series between the input ports IN1 and IN2 of the balanced input port in the first stage. Now, the voltage between the input ports IN1 and IN2 is divided between the first and the second capacitance C41 and C42 in the first stage and, therefore, the voltage charged into the first and the second capacitance C41 and C42, and the voltage multiplication factor of the amplifier, is lower than in the case where the capacitances C41 and C42 were connected in parallel. If the capacitance values of the first and the second capacitance C41 and C42 are equal, the input voltage is divided equally between the first and the second capacitance. The second stage is again similar to that illustrated in FIG. 3B, i.e. the first, second, and third capacitance C41, C42, and C43 are connected in series between the input ports IN1 and IN2.

When the desired voltage multiplication factor is one, the controller 60 may control the first switching mechanism 35 to connect the first connection port A to output port C, i.e. to the first input port IN1, and the second switching mechanism 36 to connect the second connection port B to output port F, i.e. to the second input port IN2. In this case, the first and the second capacitance are not charged in the first stage and, as a result, no voltage multiplication is obtained (amplification is 0 dB). Actually, the charge remaining in the first and the second capacitance after the second stage of a previous clock cycle is discharged in the first stage of the following clock cycle. The second stage is again similar to that illustrated in FIG. 3B, i.e. the first, second, and third capacitance C41, C42, and C43 are connected in series between the input ports IN1 and IN2.

Figure 7A:
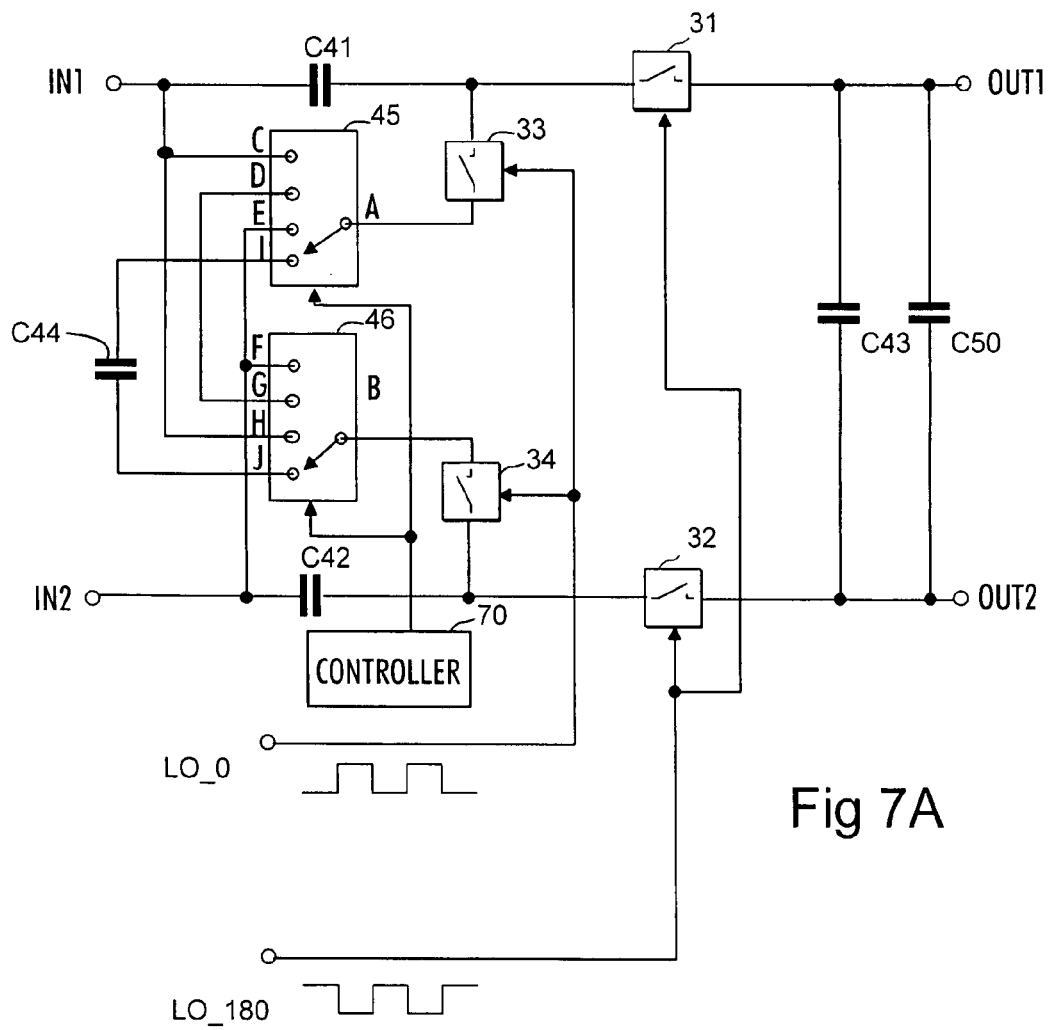
FIG. 7A illustrates a frequency mixer according to another embodiment of the invention having an automatic gain control feature.

In some cases, the desired voltage multiplication factor may, however, be other than 1 (0 dB), 2 (6 dB), or 3 (9 dB). FIG. 7A illustrates an embodiment of the invention, which is similar to the configuration illustrated in FIG. 6 except that the first and the second switching mechanism 45 and 46 now both have four output ports. The first switching mechanism 45 comprises the same output ports C, D, and E described above and an additional output port I. The second switching mechanism 46 comprises the same output ports F, G, and H described above and an additional output port J. Output ports denoted by the same letters as the corresponding output ports described above are connected as described above. The additional output port I of the first switching mechanism 45 is connected to the additional output port J of the second switching mechanism 46 through a fourth capacitance C44 Accordingly, the first set of switches connects the first, second, and fourth capacitance C41, C42, and C44 in series between the input ports IN1 and IN2 in the first stage. Accordingly, a portion of the total input voltage is charged into the fourth capacitance C44, and the rest of the input total voltage is charged into the first and the second capacitance C41 and C42. The degree of voltage charged into the fourth capacitance C44 depends on the capacitance value of the fourth capacitance C44 with respect to the capacitance values of the first and the second capacitance C41 and C42. In the second stage, the second set of switches connects the first and the second capacitance C41 and C42 in series with the third capacitance C43 between the input ports IN1 and IN2. Now, the voltage charged into the first and the second capacitance C41 and C42 is released into the third capacitance C43 in series with the input voltage. The fourth capacitance C44 is accordingly isolated from the circuit in the second stage.

In this embodiment, the voltage multiplication factor depends on the amount of input voltage charged into the fourth capacitance C44, i.e. on the capacitance value of the fourth capacitance C44. The higher the capacitance value of the fourth capacitance C44 is, the lower is the voltage over the fourth capacitance C44 in the first stage, i.e. the higher is the voltage multiplication factor of the amplifier. The capacitance value of the fourth capacitance C44 may be designed such that the frequency mixer provides a voltage multiplication factor of 1.4 (amplification of 3 dB), for example.

The voltage multiplication factor of the frequency mixer may be adjusted on-the-fly by connecting the connection ports A and B to each other through the fourth capacitance C44 and adjusting the capacitance value of the fourth capacitance C44 according to the desired voltage multiplication factor. This may be achieved, for example, by arranging additional capacitance in parallel with the fourth capacitance C44 and a selection mechanism to select the number of capacitances to be connected in parallel with the fourth capacitance C44 according to the desired voltage multiplication factor, i.e. the desired combined capacitance value of the fourth capacitance C44 and the additional capacitances to be connected in parallel with the fourth capacitance C44. The more capacitances that are connected in parallel with the fourth capacitance C44, the higher is their combined capacitance value, i.e. the higher is the effective capacitance induced by the fourth capacitance C44.

Figure 7B:
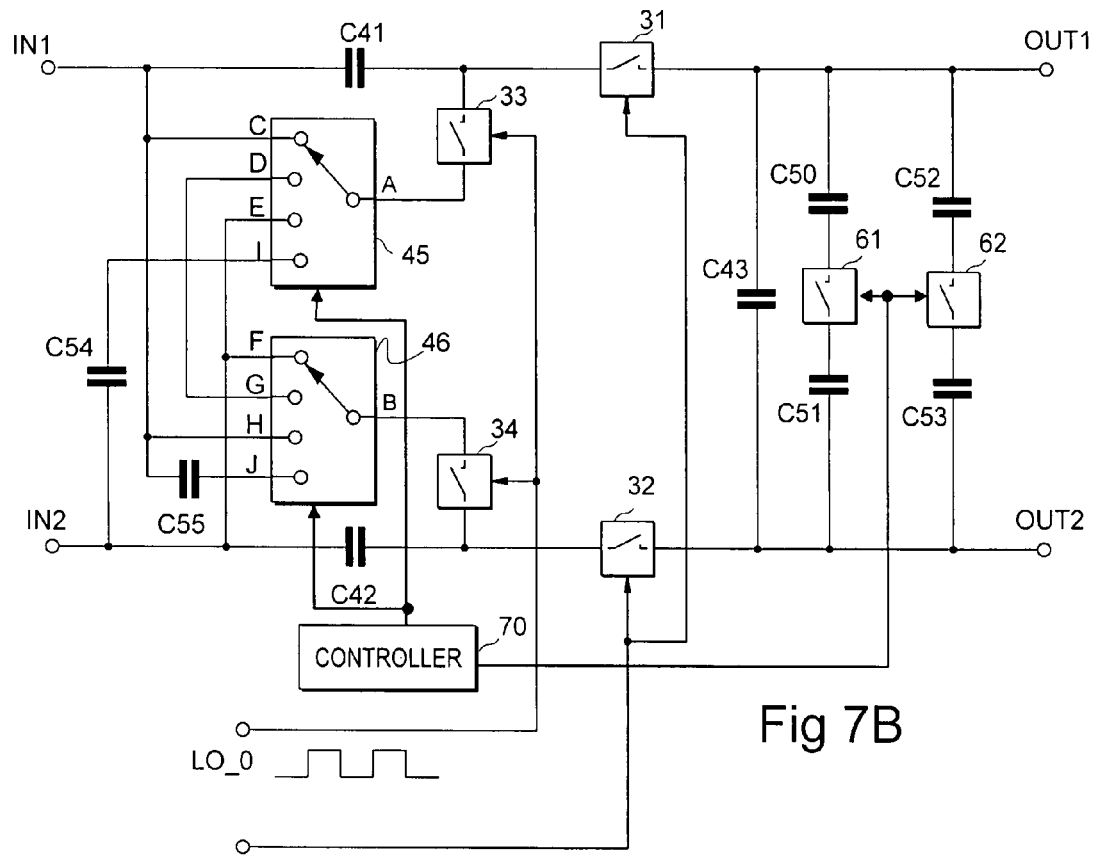
FIG. 7B illustrates a frequency mixer according to yet another embodiment of the invention having an automatic gain control feature.

In the embodiment described above with reference to FIG. 7A, the voltage multiplication factor of the amplifier is adjustable up to 6 dB, when the output ports I and J are connected to each other through the fourth capacitance C44. FIG. 7B illustrates another embodiment in which the voltage multiplication factor of the amplifier is adjustable up to 9 dB, when output port I of the first switching mechanism and output port J of the second switching mechanism are selected. This embodiment is based on the embodiment illustrated in FIG. 2. In the embodiment illustrated in FIG. 7B, a fifth capacitance C54 is arranged between output port I of the first switching mechanism 45 and the second input port IN2. Correspondingly, a sixth capacitance C55 is arranged between output port J of the second switching mechanism and the first input port IN1. Wording "fifth" and "sixth" capacitance is used in order not to cause confusion with the fourth capacitance comprised in the embodiment described above.

When output ports I and J are selected, the first set of switches (the first and the second switch 33 and 34) connects the first capacitance C41 in series with the fifth capacitance C54 and in parallel with the second and the sixth capacitance C42 and C55 between the input ports IN1 and IN2. Obviously, the second and the sixth capacitance C42 and C55 are also connected in series with respect to each other. Consequently, the voltage between the input ports IN1 and IN2 is divided between the first and the fifth capacitance C41 and C54 and between the second and the sixth capacitance C42 and C55. Therefore, the voltage over the first capacitance C41 depends on the capacitance value of the fifth capacitance C54 and the voltage over the second capacitance C42 depends on the capacitance value of the sixth capacitance C55. The higher is the capacitance values of the fifth and the sixth capacitance C54 and C55, the higher is the voltage over the first and the second capacitance C41 and C42, respectively. The second stage is similar to the embodiments described above, i.e. the second set of switches connects the first and the second capacitance C41 and C42 in series with the third capacitance C43 between the input ports IN1 and IN2. Accordingly, the fifth and the sixth capacitance C54 and C55 are isolated from the circuit in the second stage.

Figure 9:
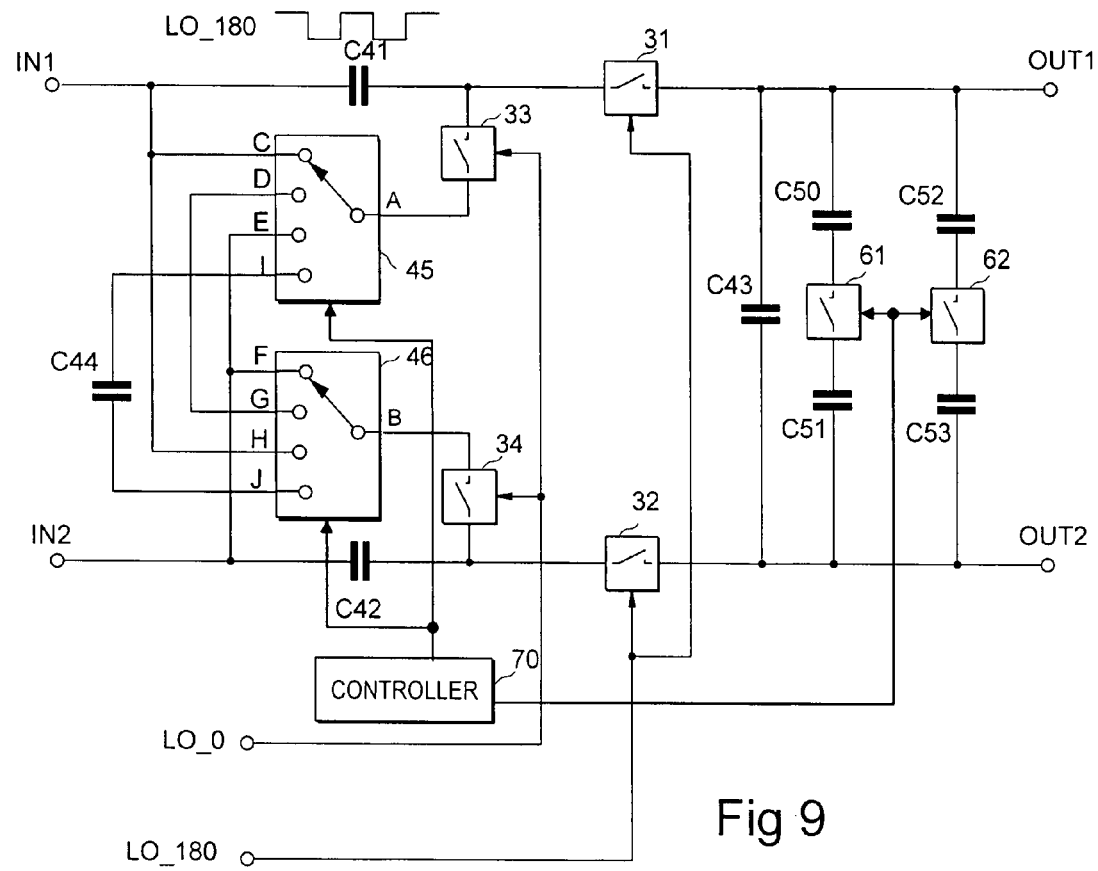
FIG. 9 illustrates a frequency mixer according to an embodiment of the invention having an adjustable low-pass corner frequency.

Referring to FIGS. 7B and 9, additional capacitances C50, C51, C52, C53 may be arranged in parallel with the third capacitance C43 to adjust the corner frequency of the low-pass filter. Referring to equation (2), the corner frequency is now affected by the combined capacitance of the third and the additional capacitances C43 and C50 to C53. In FIG. 9, additional capacitances C50 to C53 are arranged in parallel with the third capacitance C43 in pairs, and a switch 61 and 62 is provided between a pair of additional capacitance. For example, capacitances C50 and C51 are arranged in series with respect to each other and in parallel with respect to the third capacitance C43, and switch 61 is provided between the capacitances C50 and C51 to select the pair. Capacitances C52 and C53 and switch 62 are arranged similarly. The additional capacitances may be arranged in pairs to maintain the balance of the frequency mixer. Alternatively, a switch may be arranged on both terminals of one additional capacitance, i.e. the additional capacitances C50 to C53 may be replaced with switches and switches 61 and 62 may be replaced with capacitances. There may be more additional capacitances connectable in parallel with the third capacitance C43 than illustrated in FIGS. 7B and 9, and the number of additional capacitances connectable in parallel with the third capacitance C43 may depend on the actual implementation.

When controlling the switching mechanisms 45 and 46 according to the desired amplification of the frequency mixer, the corner frequency of the low-pass filter may change depending on the selected output port of the first and the second switching mechanism 45 and 46. The additional capacitances C50 to C53 may be selected to compensate for the change in the corner frequency. Accordingly, the switches 61 and 62 may be controlled by the same controller 70 controlling the switching mechanisms 45 and 46.

The above-described structure for tuning the corner frequency may be utilized in a frequency mixer belonging to a multi-mode telephone operating on several frequency bands, and the corner frequency may be set according to the bandwidth of transmitted or received radio signals. For example, the corner frequency may be set to 100 kHz when operating with signals according to the GSM specification and to 2 MHz when operating with signals according to the WCDMA specification.

In summary and with reference to FIGS. 2, 6 and 7A and 7B, the frequency mixer according to embodiments of the invention performs the following operations:
1. Frequency mixes (unit 38 in FIG. 8) the input signal radio frequency signal with the local oscillator signal LO, thereby generating an output signal having a frequency which is the difference between the frequencies of the input signal and the local oscillator signal LO_0 and LO_180. Accordingly, $f_{IF\_OUT}=f_{RF\_IN}-f_{LO}$ or $f_{IF\_OUT}=f_{LO}-f_{RF\_IN}$.
2. a. During the frequency mixing process, multiplies the voltage level of the input signal with a factor which may be selected between the minimum and maximum (9.5 dB) voltage multiplication factor as required. The amplification, i.e. the voltage multiplication factor, may be selected on-the-fly, thereby providing the frequency mixer with AGC functionality. The amplification may be made selectable between $-\infty$ and 9 dB. Accordingly, the frequency mixer may operate also as a passive attenuator. Accordingly, the output voltage level may be up to three times higher than that of a prior art passive mixer providing no amplification feature.
3. During the frequency mixing process, low-pass filters the input signal. The corner frequency of the low-pass filtering may be defined by the ratio of capacitances in the frequency mixer.

While the embodiments are described above in conjunction with balanced input and output ports, an embodiment employing dual balanced input ports and output ports may be formed by arranging two balanced passive amplifier structures in parallel and providing input signals into corresponding balanced input ports of the parallel structures in opposite phases and also obtaining output signals from corresponding balanced output ports of the parallel structures in opposite phases. In this structure, the oscillator signal may be input into corresponding input ports of the parallel structures in the same phase. Alternatively, oscillator signals may be provided into corresponding oscillator signal input ports of the of the parallel structures in opposite phases and signals in the corresponding input or output ports of the parallel structures are arranged to be in opposite phases. In a further alternative solution, the input signals, oscillator signals, or the output signals may be provided into (or obtained from) the corresponding ports of the parallel structures in opposite phases and switches of one structure may be implemented with NMOS transistors and switches of the other structure may be implemented with PMOS transistors. Other solutions for arranging a dual balanced structure are also possible. Advantages obtained with a dual balanced structure depend on the actual implementation but, generally, leakage of the oscillator signals into the input ports is lower with a dual-balanced structure. Additionally, loads experienced by the oscillator signals equalize better with respect to the balanced structure, and this property facilitates maintaining the correct phasing of the oscillator signals.

Figure 8:
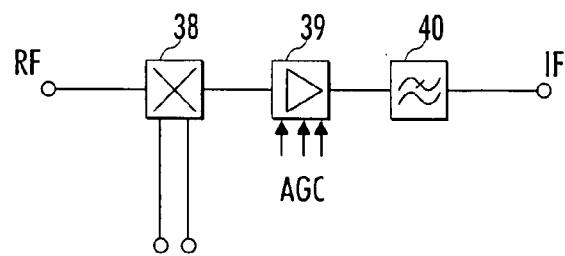
FIG. 8 illustrates features of the frequency mixer according to embodiments of the invention.

The functionality of the frequency mixer according to embodiments of the invention corresponds to the block diagram illustrated in FIG. 8. The frequency mixer according to an embodiment of the invention performs the frequency mixing (block 38), voltage multiplication (block 39), and low-pass filtering (block 40) operations by alternately closing and opening the switches 31 to 34. The only difference is that the operations performed in the three blocks illustrated in FIG. 8 are performed in one block in the frequency mixer according to the embodiments of the invention. Accordingly, the three operations may be carried out with the same components.

Figure 10:
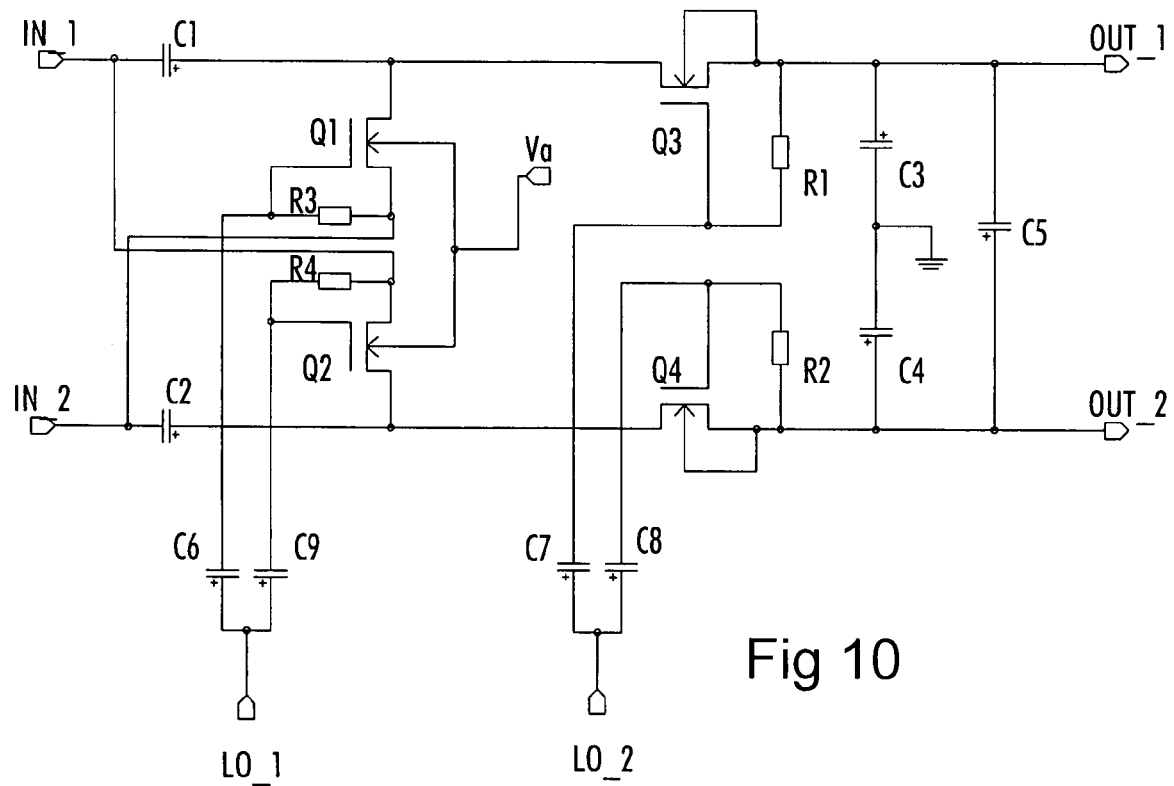
FIG. 10 illustrates the detailed structure for a frequency mixer according to an embodiment of the invention.

FIG. 10 illustrates a detailed implementation of a frequency mixer according to the embodiment of the invention illustrated in FIG. 2. Clearly, the implementation has a very simple structure. The implementation has balanced input and output ports IN_1, IN_2, OUT_1, and OUT_2, which is very common in RF integrated circuits nowadays. The analogy between the embodiments described next and the embodiment of the balanced frequency mixer illustrated in FIG. 2 is evident.

In the implementation illustrated in FIG. 10, capacitors C1, C2, and C3 to C5 correspond to the first, second, and third capacitance C41, C42, and C43 of FIG. 2, respectively. In other words, the third capacitance C43 has been implemented with three capacitances C3, C4, and C5. Capacitances C3 and C4 may be selected to be very small, since their main function is to attenuate the local oscillator signals LO_1 and LO_2 in order to prevent their leakage to the output ports (OUT_1 and OUT_2).

The first switch 33 may be implemented with a MOS transistor Q1, and the second switch 34 may be implemented with a MOS transistor Q2. The transistors Q1 and Q2 are implemented such that a local oscillator signal LO_1 (corresponds to LO_0) is applied to the gates of the transistors Q1 and Q2. Accordingly, the gates of the transistors Q1 and Q2 are connected to each other. A source of transistor Q1 may be connected to the second input port IN_2, and a source of transistor Q2 may be connected to the first input port IN_1. Drains of the transistors Q1 and Q2 may be connected to the first capacitor C1 and the second capacitor C2, respectively.

The third and the fourth switch 31 and 32 have been implemented with MOS transistors Q3 and Q4. The second oscillator signal LO_2 may be applied to gates of the transistors Q3 and Q4. A source of transistor Q3 may be connected to a first terminal of capacitor C5, and a source of transistor Q4 may be connected to the other terminal of capacitor C5. Drains of transistors Q3 and Q4 may be connected to capacitors C1 and C2, respectively.

A DC voltage source Va may be connected to the gates of the MOS transistors Q1 and Q2. The DC voltage supplied by the voltage source Va may be selected according to the implementation. The DC voltage sets a bulk-source voltage of transistors Q1 and Q2 to an appropriate level. In practice, the voltage supplied by the voltage source Va has an effect on a threshold voltage of transistors Q1 and Q2 and the actual voltage level may depend on a duty cycle of the first oscillator signal LO_1. Similarly, the same DC voltage may be applied to the gates of MOS transistors Q3 and Q4, if necessary.

The switches may be implemented by NMOS and/or PMOS transistors, for example. In case all of the switches are NMOS or PMOS transistors two local oscillator signals having opposite phases, i.e. two different local oscillator signals may be applied to the frequency mixer, as described above. Alternatively, the transistors Q1 and Q2 may be NMOS transistors and transistors Q3 and Q4 may be PMOS transistors. Now, two local oscillator signals are not necessary. The same local oscillator signal may be applied to all transistors Q1 to Q4. Transistors Q1 and Q2 are closed during a positive half cycle of the local oscillator signal and open during a negative half cycle of the local oscillator signal. On the other hand, transistors Q3 and Q4 are closed during the negative half cycle of the local oscillator signal and open during the positive half cycle of the local oscillator signal. Of course, Q1 and Q2 may be PMOS transistors and Q3 and Q4 NMOS transistors. Accordingly, the operation of the first and the second set of switches may be complementary in the sense that both sets of switches are not closed at the same time.

When designing the SC low-pass filter implemented with the circuit illustrated in FIG. 10, the starting point is equation (2) described above. Since the implementation relates to an RF circuit, the design cannot be based on equation (2) alone. Issues to be considered in the implementation include the on-resistance of the MOS transistors Q1, Q2, Q3, and Q4, output impedance of the previous stage preceding the frequency mixer (amplifier or bandpass filter, for example), impedance of the load of the frequency mixer, pulse shape and pulse ratio of the local oscillator signal, and various capacitances caused by the components of the frequency mixer.

In FIG. 10, resistors R1, R2, R3, R4 and capacitors C6, C7, C8, and C9 are specific to the implementation and selected accordingly.

Figure 11:
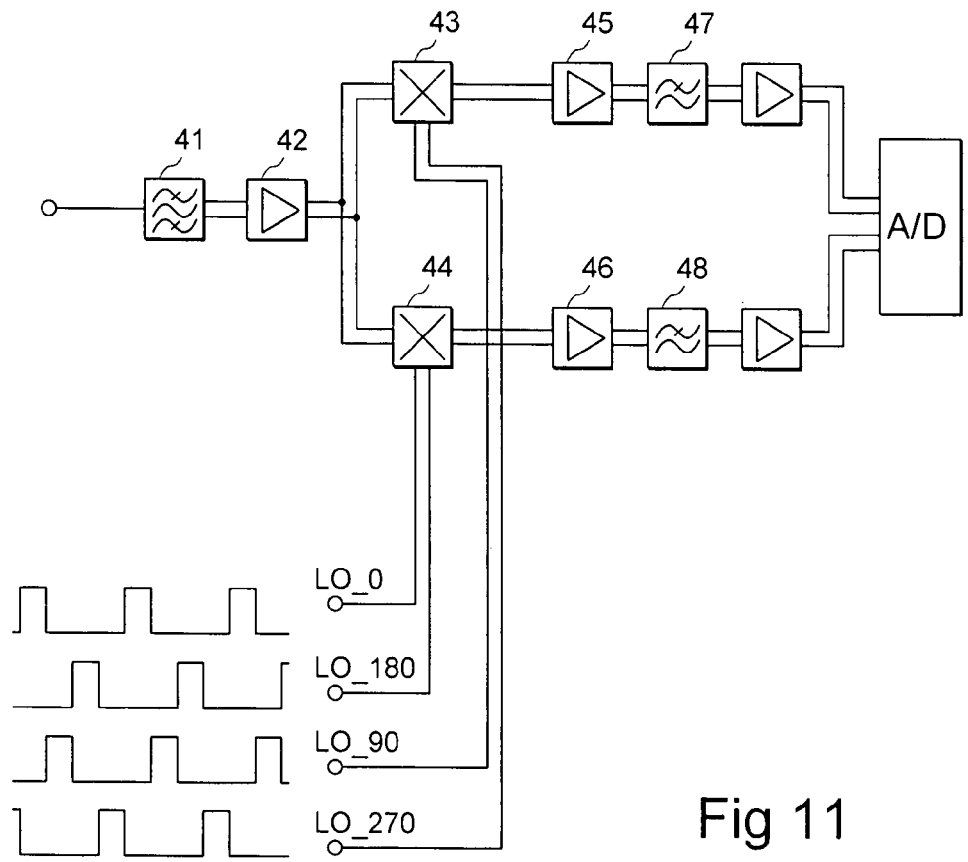
FIG. 11 illustrates the receiver structure of a radio transceiver according to an embodiment of the invention.

FIG. 11 illustrates the structure of a radio receiver (or transceiver) utilizing the frequency mixer according to an embodiment of the invention. Before frequency mixers 43 and 44, a received RF signal may be bandpass filtered in a bandpass filter 41 and amplified in a low-noise amplifier 42. The received RF signal is separated into an in-phase (I) component and a quadrature (Q) component with a proper selection of the phases of the local oscillator signal. Local oscillator signals having zero degree and 180 degree phase shifts LO_0 and LO_180 may be applied to a first frequency mixer 44 and local oscillator signals having 90 degree and 270 degree phase shifts LO_90 and LO_270 may be applied to a second frequency mixer 43. Frequency mixers 43 and 44 may be implemented according to any embodiment described above. Frequency-mixed output signals of the frequency mixers 43 and 44 may be further amplified in the respective baseband amplifiers 45 and 46 and low-pass filtered in the respective low-pass filters 47 and 48. In this implementation, the pulse ratio of the local oscillator signal may be less than or equal to 25/75 in order to prevent overlapping of the local oscillator signal pulses.

Figure 12:
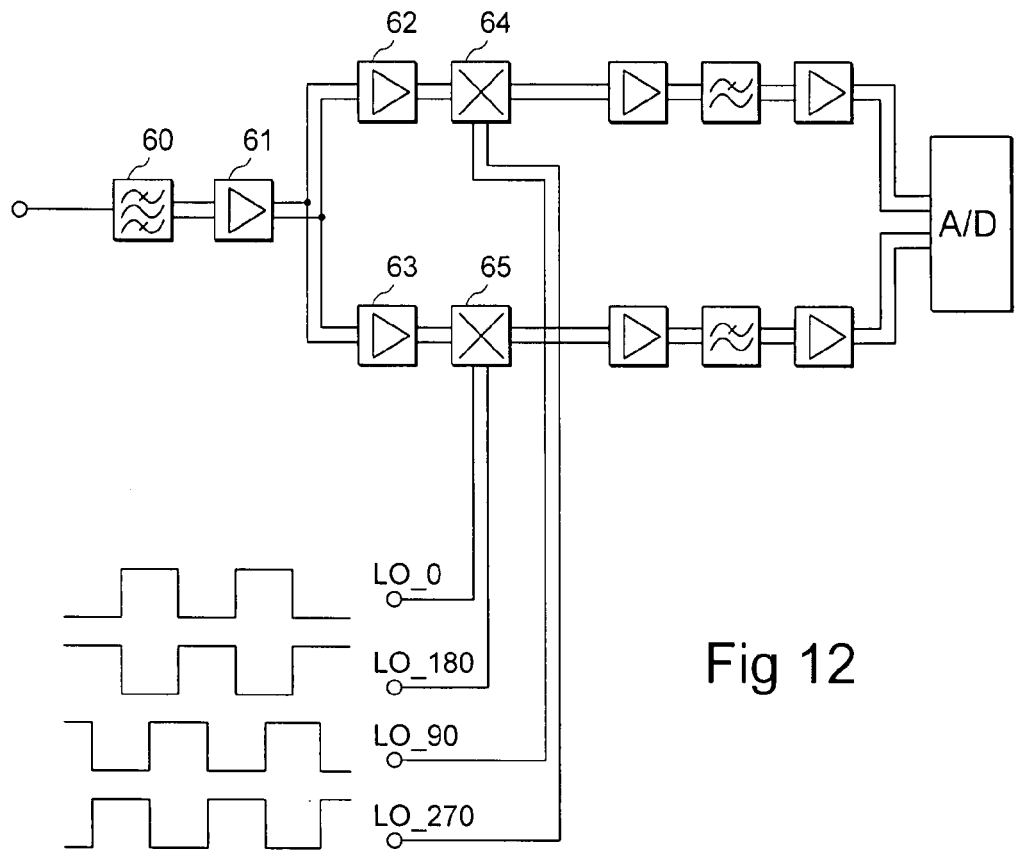
FIG. 12 illustrates the receiver structure of a radio transceiver according to another embodiment of the invention.

FIG. 12 illustrates an implementation in which the pulse ratios of the local oscillator signals LO_0, LO_90, LO_180, and LO_270 may be 50/50, since amplifiers 62 and 63 preceding the respective frequency mixers 64 and 65 separate the I and Q components from each other on the input RF port side. The bandpass filter 60 and the low-noise amplifier 61 may be common to the I and Q component of the received RF signal.

Figure 13:
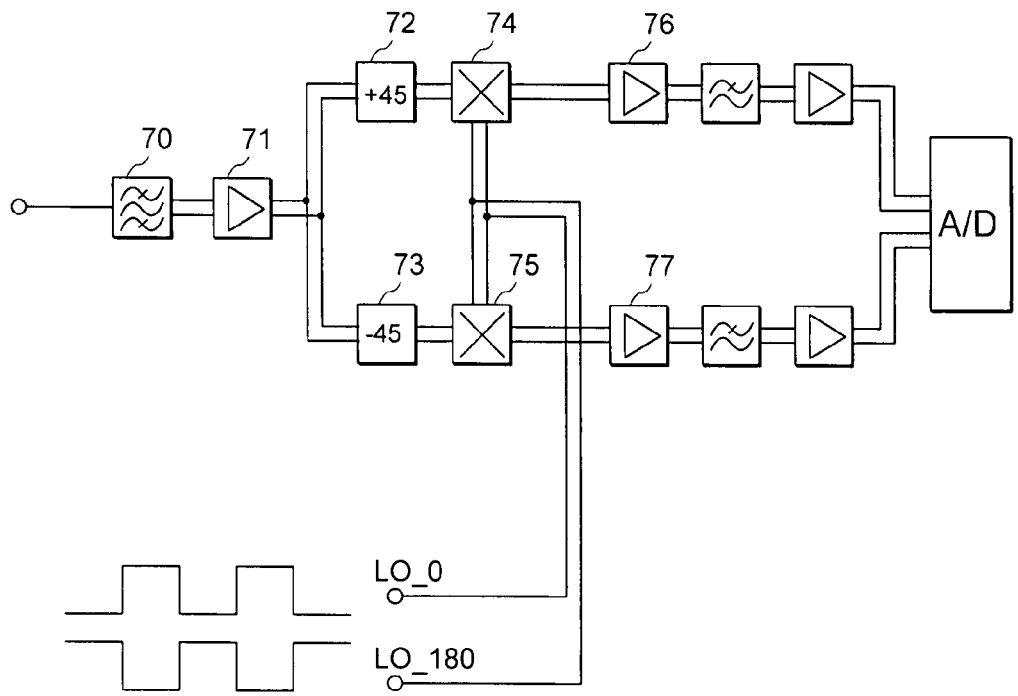
FIG. 13 illustrates the receiver structure of a radio transceiver according to still another embodiment of the invention.

FIG. 13 illustrates an implementation in which the same local oscillator signals LO_0 and LO_180 may be applied to both frequency mixers 74 and 75. Again, a bandpass filter 70 and a low-noise amplifier 71 may precede the frequency mixers 74 and 75. Phase shifters 72 and 73 preceding the frequency mixers 74 and 75 shift the phases of an input RF signal by +45 and −45 degrees, respectively, thereby separating the I and Q component. Alternatively, the phase shifters 72 and 73 may shift the phase of the input signal with different phase shifts in order to produce the 90-degree phase shift between the I and Q components. One of the phase shifters 72 and 73 may even be omitted, if the other makes a 90-degree phase shift. After the frequency mixers 74 and 75, the frequency-mixed signals are fed to amplifiers 76 and 77 for further amplification.

One skilled in the art appreciates that the frequency mixer according to embodiments of the invention and the radio transceiver utilizing the frequency mixer may be implemented in numerous different ways. The switches in the frequency mixer may be implemented with GaAs FET transistors, SOI-CMOS transistors, diodes, etc. The frequency mixer may be implemented as an integrated circuit or on a printed circuit board, for instance. The frequency mixer according to an embodiment of the invention may be utilized in virtually any radio communication device. The radio communication device may be a radio transceiver or simply a radio receiver. The radio communication device may be a mobile phone, a Global Positioning System (GPS) receiver, a Galileo receiver, a Wireless Local Area Network (WLAN) transceiver, a Bluetooth® transceiver, an FM radio receiver, a television signal receiver (DVB-T or DVB-H, for example), an AM receiver, a short wave radio transceiver, etc.

The frequency mixers described herein downmix an input RF signal, i.e. converts the input RF signal to the baseband. Alternatively, the frequency mixers according to embodiments of the invention may downmix the input signal to an intermediate frequency (IF). While the frequency mixer according to an embodiment of the invention is preferably utilized in a radio receiver, the frequency mixer may also be implemented as an upconverting frequency mixer which converts an input baseband signal to an RF signal. Even though the invention has been described above with reference to an example according to the accompanying drawings, it is clear that the invention is not restricted thereto but it can be modified in several ways within the scope of the appended claims.

The invention claimed is:

1. An apparatus, comprising:
   an input interface comprising a balanced input port configured to receive a balanced input signal and an oscillator signal input port configured to receive a first oscillator signal and a second oscillator signal;
   a first capacitance;
   a second capacitance;
   a third capacitance;
   a first set of switches responsive to the first oscillator signal and configured to connect, in response to the first oscillator signal, the first capacitance and the second capacitance between a first input port and a second input port of the balanced input port;
   a second set of switches responsive to the second oscillator signal and configured to connect, in response to the second oscillator signal, the first capacitance between the first input port and the third capacitance and the second capacitance between the second input port and the third capacitance; and
   an output port connected to terminals of the third capacitance.

2. The apparatus of claim 1, wherein a first terminal of the first capacitance is connected to the first input port and a first terminal of the second capacitance is connected to the second input port, wherein the first set of switches is configured to connect, when closed, a second terminal of the first capacitance to the second input port and a second terminal of the second capacitance to the first input port, and wherein the second set of switches is configured to connect, when closed, the second terminal of the first capacitance to a first terminal of the third capacitance and the second terminal of the second capacitance to a second terminal of the third capacitance.

3. The apparatus of claim 1, wherein the first oscillator signal and the second oscillator signal are a same oscillator signal.

4. The apparatus of claim 1, further comprising:
   a local oscillator signal generator configured to generate and apply to the oscillator input port the first oscillator signal and the second oscillator signal, wherein the first oscillator signal and the second oscillator signal have opposite phases.

5. The apparatus of claim 4, wherein the apparatus is configured to receive a radio frequency input signal through the balanced input port, and the local oscillator signal generator is configured to produce the first oscillator signal and the second oscillator signal to have a frequency suitable for converting the frequency of the input signal to a desired target frequency.

6. The apparatus according to claim 1, further comprising:
a controllable switching mechanism configured to connect, when the first set of switches is closed, the first capacitance and the second capacitance between the first input port and the second input port either in series or in parallel depending on a desired voltage multiplication factor effected by the apparatus on an input signal input to the balanced input port.

7. The apparatus of claim 6, wherein the switching mechanism is configured to connect the first capacitance and the second capacitance between the first input port and the second input port in series when the desired voltage multiplication factor is two and in parallel when the desired voltage multiplication factor is three.

8. The apparatus of claim 6, wherein the switching mechanism is further configured to connect, when the first set of switches is closed, two terminals of the first capacitance to the first input port and two terminals of the second capacitance to the second input port when the desired voltage multiplication factor is one.

9. The apparatus according to claim 1, wherein the apparatus is configured to function as a low-pass filter having a corner frequency defined by the ratios of the capacitance values of the first capacitance and the third capacitance and the second capacitance and the third capacitance, respectively.

10. The apparatus according to claim 1, wherein a first terminal of the first capacitance is connected to the first input port and a first terminal of the second capacitance is connected to the second input port, wherein the first set of switches comprises a first switch connected between a second terminal of the first capacitance and the second input port and a second switch connected between a second terminal of the second capacitance and the first input interface, and wherein the second set of switches comprises a third switch connected between the second terminal of the first capacitance and a first terminal of the third capacitance and a fourth switch connected between the second terminal of the second capacitance and a second terminal of the third capacitance.

11. The apparatus according to claim 1, further comprising:
a fourth capacitance,
wherein the first set of switches is configured to connect, when closed, the fourth capacitance together with the first capacitance and the second capacitance in series between the first input port and the second input port of the balanced input port.

12. The apparatus of claim 11, further comprising:
an adjustment circuit configured to adjust the capacitance value of the fourth capacitance, and to control a voltage multiplication factor of the apparatus.

13. The apparatus according to claim 1, wherein the apparatus is further configured to function as a voltage multiplier by configuring the first oscillator signal to close the first set of switches and accordingly charge the first and the second capacitance during the first half cycle of the first oscillator signal, and configuring the second oscillator signal to close the second set of switches and accordingly release the charge in the first capacitance together with the input signal to the second capacitance during the second half cycle of the second local oscillator signal, in order to sum the voltages charged into the first capacitance and the second capacitance and the voltage over the first input port and the second input port.

14. The apparatus of claim 1, having a dual balanced structure.

15. A frequency mixing device, comprising:
an input interface comprising a balanced input port configured to receive a balanced input signal and an oscillator signal input port configured to receive a first oscillator signal and a second oscillator signal;
a first capacitance;
a second capacitance;
a third capacitance;
a first set of switches responsive to the first oscillator signal and configured to connect, in response to the first oscillator signal, the first capacitance and the second capacitance between a first input port and a second input port of the balanced input port;
a second set of switches responsive to the second oscillator signal and configured to connect, in response to the second oscillator signal, the first capacitance between the first input port and the third capacitance and the second capacitance between the second input port and the third capacitance; and
an output port connected to terminals of the third capacitance.

16. A radio apparatus comprising a frequency-mixing device apparatus, comprising:
an input interface comprising a balanced input port configured to receive a balanced input signal and an oscillator signal input port configured to receive a first oscillator signal and a second oscillator signal;
a first capacitance;
a second capacitance;
a third capacitance;
a first set of switches responsive to the first oscillator signal and configured to connect, in response to the first oscillator signal, the first capacitance and the second capacitance between a first input port and a second input port of the balanced input port;
a second set of switches responsive to the second oscillator signal and configured to connect, in response to the second oscillator signal, the first capacitance between the first input port and the third capacitance and the second capacitance between the second input port and the third capacitance; and
an output port connected to terminals of the third capacitance.

17. The radio apparatus of claim 16, wherein the radio transceiver is configured to receive a radio frequency signal comprising an in-phase component and a quadrature component, and the radio transceiver further comprises a separate frequency mixer for the in-phase component and a separate frequency mixer for the quadrature component.

18. The radio apparatus of claim 17, wherein phases of oscillator signals applied to the separate frequency mixer associated with the quadrature component differ 90 degrees from respective phases of oscillator signals applied to the separate frequency mixer associated with the in-phase component, and wherein local oscillator signals have a maximum pulse ratio of 25/75.

19. The radio apparatus of claim 17, further comprising:
a separate amplifier for each of the separate frequency mixers to precede the separate frequency mixers,
wherein phases of local oscillator signals applied to the separate frequency mixer associated with the quadrature component differ 90 degrees from respective phases of local oscillator signals applied to the separate frequency mixer associated with the in-phase component and wherein the local oscillator signals have a maximum pulse ratio of 50/50.

20. The radio apparatus of claim 17, further comprising:
a phase shifter preceding at least one of the separate frequency mixers,
wherein the phase shifter preceding the at least one of the frequency mixers is configured to shift the phase of at least one of the in-phase component and the quadrature component to produce a 90-degree phase difference between the in-phase component and the quadrature component.

21. The radio apparatus of claim 20, wherein a same local oscillator signal is applied to both separate frequency mixers.

22. A method, comprising:
receiving an input signal through a first input port and a second input port of a balanced input port and a first oscillator signal and a second oscillator signal through an oscillator signal input port;
connecting, in a first stage in response to a first oscillator signal, a first capacitance and a second capacitance between the first input port and the second input port of the balanced input port;
connecting, in a second stage in response to a second oscillator signal, the first capacitance between the first input port and a third capacitance and the second capacitance between the second input port and the third capacitance, and
obtaining a voltage over the third capacitance as an output voltage.

23. The method of claim 22, further comprising:
connecting a first terminal of the first capacitance connected to the second input port in the first stage to the third capacitance at the second stage; and
connecting a first terminal of the second capacitance to the first input port in the first stage is connected to a second terminal of the third capacitance in the second stage.

24. The method of claim 22, further comprising:
charging, in the first stage, the first capacitance and the second capacitance with a voltage corresponding to a voltage over the first input port and the second input port; and
releasing, in the second stage, the charge in the first capacitance and the second capacitance into the third capacitance in series with a current voltage over the first input port and the second input port, in order to produce, over the third capacitance, a voltage that is the sum of the voltage charged into the first capacitance at the first stage, the voltage charged into the second capacitance at the first stage, and the current voltage over the first input port and the second input port.

25. The method of claim 22, further comprising:
configuring the first oscillator signal and the second oscillator signal to be a same oscillator signal.

26. The method of claim 22, further comprising:
configuring the first oscillator signal and the second oscillator signal to have a same frequency and different phases.

27. The method of claim 22, further comprising:
configuring the received input signal to be a radio frequency input signal; and
configuring the first oscillator and the second oscillator signal to have a frequency suitable for converting a frequency of the radio frequency input signal to a desired target frequency.

28. The method of claim 22, further comprising:
connecting, in the first stage, the first capacitance and the second capacitance between the first input port and the second input port either in series or in parallel depending on a desired voltage multiplication factor of the output signal relative to the input signal.

29. The method of claim 28, further comprising:
connecting, in the first stage, the first capacitance and the second capacitance between the first input port and the second input port in series when the desired voltage multiplication factor is two and in parallel when the desired voltage multiplication factor is three.

30. The method of claim 28, further comprising:
connecting two terminals of the first capacitance to the first input port in the first stage; and
connecting two terminals of the second capacitance to the second input port in the first stage when the desired voltage multiplication factor is one.

31. The method of claim 28, further comprising:
connecting, in the first stage, the first capacitance and the second capacitance in series between the first input port and the second input port; and
providing, in series with the first capacitance and the second capacitance, an additional capacitance having a capacitance value determined according to the desired voltage multiplication factor.

32. The method of claim 22, further comprising:
defining a corner frequency of a low-pass filter with the capacitance values of the first capacitance, the second capacitance, and the third capacitance; and
low-pass filtering the input signal input to the first input port and the second input port.

33. The method of claim 22, further comprising:
connecting, in the first stage, the first capacitance and the second capacitance between the first input port and the second input port in series;
providing a fourth capacitance in series between the first capacitance and the second capacitance in the first stage; and
adjusting a capacitance value of the fourth capacitance according to a desired voltage multiplication factor of the output signal relative to the input signal.

34. The method of claim 22, further comprising:
charging the first capacitance and the second capacitance alternately with the third capacitance.

35. The method of claim 22, which method is carried out in an apparatus having a dual balanced structure.

36. An apparatus, comprising:
input means comprising a first and a second input port of a balanced input port configured to receive a balanced input signal and an oscillator signal input means configured to receive a first oscillator and a second oscillator signal;
first capacitance means for storing charge;
second capacitance means for storing charge;
third capacitance means for storing charge;
first connection means for connecting, in a first stage in response to the first oscillator signal, the first capacitance means and the second capacitance means between the first input port and the second input port of the balanced input port;
second connection means for connecting, in a second stage in response to the second oscillator signal, the first capacitance means between the first input port and the third capacitance means and the second capacitance means between the second input port and the third capacitance means, and
output means for obtaining a voltage over the third capacitance means as an output voltage.

* * * * *